United States Patent [19]

Natens

[11] 4,201,948
[45] May 6, 1980

[54] PHASE-LOCKED LOOP CLOCK PULSE EXTRACTION CIRCUIT

[75] Inventor: Marcel C. R. Natens, Antwerp, Belgium

[73] Assignee: International Standard Electric Corporation, New York, N.Y.

[21] Appl. No.: 909,241

[22] Filed: May 24, 1978

[51] Int. Cl.$^2$ .............................................. H03B 3/04
[52] U.S. Cl. ...................................... 331/8; 329/122; 331/17; 331/27
[58] Field of Search ................... 331/8, 17, 18, 23, 25, 331/27; 329/122, 124

[56] References Cited

U.S. PATENT DOCUMENTS

| | | | |
|---|---|---|---|
| 3,821,658 | 6/1974 | Hoeft | 331/8 |
| 3,944,940 | 3/1976 | Desai | 331/27 X |

Primary Examiner—Siegfried H. Grimm
Attorney, Agent, or Firm—John T. O'Halloran; Alfred C. Hill

[57] ABSTRACT

A circuit for extracting a clock pulse waveform from an input pulse waveform comprising a phase-locked loop including a phase comparator having a first input to which the input pulse waveform is supplied, a second input and an output which is coupled in cascade at least with a voltage controlled oscillator whose output is coupled to the second input of the phase comparator. The clock pulse waveform is provided at the output of the oscillator. The phase comparator includes gating circuits controlled by the clock waveform and the input waveform to produce first and second intermediate pulse waveforms each having pulses constituted by different portions of the pulses of the input waveform and proportional to the pulse density of the input waveform, filter circuits connected directly to the gate circuits responsive to the first and second intermediate waveforms to produce first and second output waveforms which are equal to the mean amplitude values of the first and second intermediate waveforms and a subtractor circuit to produce a comparator output signal which is a function of the ratio of the first and second output waveforms and independent of the pulse density of the input waveform.

9 Claims, 2 Drawing Figures

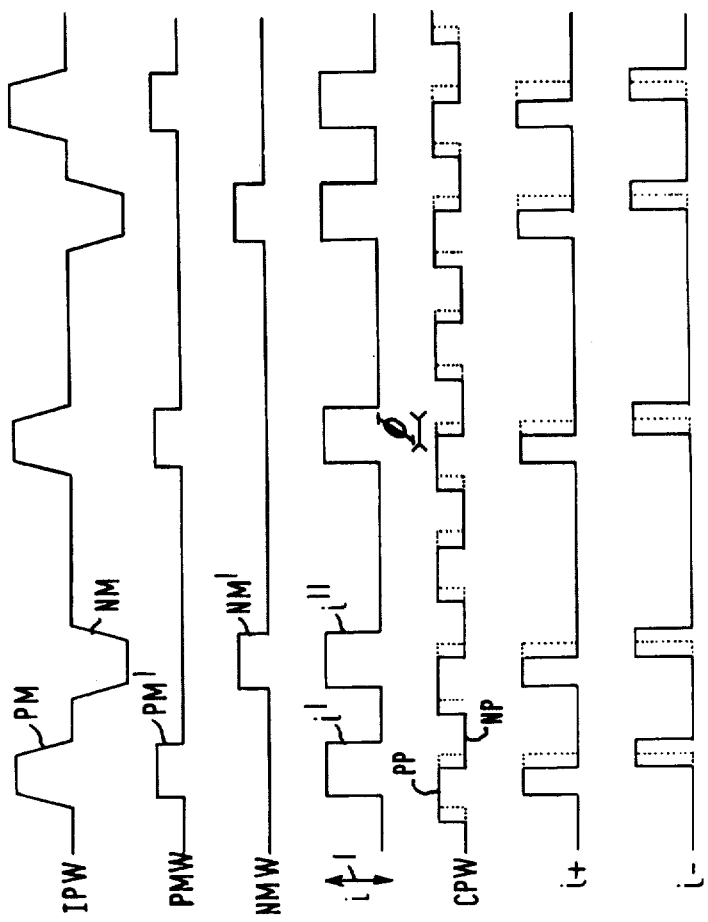

PHASE-LOCKED LOOP CLOCK PULSE EXTRACTION CIRCUIT

BACKGROUND OF THE INVENTION

The present invention relates to a timing extraction circuit for extracting a clock pulse waveform from an input pulse waveform, the circuit including a phase-locked loop with a phase comparator having a first input to which the input pulse waveform is supplied, a second input and an output which is coupled in cascade at least with a controlled oscillator the output of which is coupled to the second input of the phase comparator, the clock pulse waveform being generated at the output of the controlled oscillator.

Such a timing extraction circuit is generally known in the art, e.g. from the article "The Jitter Performance of Phase-Locked Loops Extracting Timing From Baseband Data Wave forms" by D. L. Duttweiler, published in the Bell System Technical Journal, January 1976, pp. 37–58, more particularly pp. 45–47. A drawback of this known circuit is that the correction signal representing the phase error between the clock pulse waveform and the input pulse waveform is proportional to the probability of having a transistion (a negative going or a positive-going change or excursion) in the input pulse wavform, i.e. to the pulse density of the latter waveform.

SUMMARY OF THE INVENTION

An object of the invention is, therefore, to provide a timing extraction circuit of the above type but wherein the last mentioned correction signal is independent from the pulse density of the input pulse waveform.

According to the invention this object is achieved due to the fact that the phase comparator includes first means controlled by the input pulse waveform and by the clockpulse waveform, having transitions occurring substantially in the middle of the pulses of the input pulse waveform, and able to provide first and second output waveforms which are equal to the mean amplitude values of first and second intermediate pulse waveforms the pulses of which are constituted by different portions of the pulses of the input pulse waveform and which are both proportional to the pulse density of the input pulse waveform, and that the phase comparator further includes second means coupled with the first means and providing a comparator output signal which is a function of the ratio of the first and second output waveforms.

Hence the comparator output signal is independent from the pulse density of the input pulse waveform.

A further characteristic feature of the present timing extraction circuit is that the first means includes first and second filter circuits and first and second gating circuits the outputs of which are coupled with the first and second filter circuits, respectively, the input pulse waveform being supplied to both the first and second gating circuits which are controlled by the clock pulse waveform and the inverse thereof, respectively so that the first and second intermediate pulse waveforms are provided at the output of the first and second gating circuits, respectively and are supplied to the first and second filter circuits, respectively, which in response thereto provide the first and second output waveforms.

In accordance with a preferred embodiment of the invention the present timing extraction circuit for extracting a clock pulse waveform from an input pulse waveform includes a phase comparator having a first input to which the input pulse waveform is supplied, a second input and an output which is coupled in cascade with a filter network and a voltage controlled oscillator the output of which is coupled to the second input of the phase comparator and which provides the clock pulse waveform at its output. This comparator includes first and second gating circuits to which the input pulse waveform is supplied and which are controlled by the clock pulse waveform and the inverse thereof, respectively. Thus, there are generated first and second intermediate pulse waveforms the pulses of which are constituted by first and second different portions of the input pulse waveform. The outputs of these first and second gating circuits are connected to first and second filter circuits which provide at their outputs first and second output waveforms which are equal to the mean values of the first and second intermediate pulse waveforms and which are both proportional to the pulse density of the input pulse waveform. Each of the filter circuits includes a capacitor connected in parallel with the series connection of a resistance and the base-to-emitter junction of a transistor, the junction points of the latter elements being connected to respective inputs of a differential amplifier providing at its output a voltage signal which is equal to the logarithm of the ratio of the first and second output waveforms and which is, therefore, independent from the pulse density of the input pulse waveform.

BRIEF DESCRIPTION OF THE DRAWING

The above mentioned and other objects and features of the invention will become more apparent and the invention itself will be best understood by referring to the following description of an embodiment taken in conjunction with the accompanying drawings in which: FIG. 2 represents pulse waveforms appearing at different points of the circuit of FIG. 1.

DESCRIPTION OF THE PREFERRED EMBODIMENT

Figure 1:
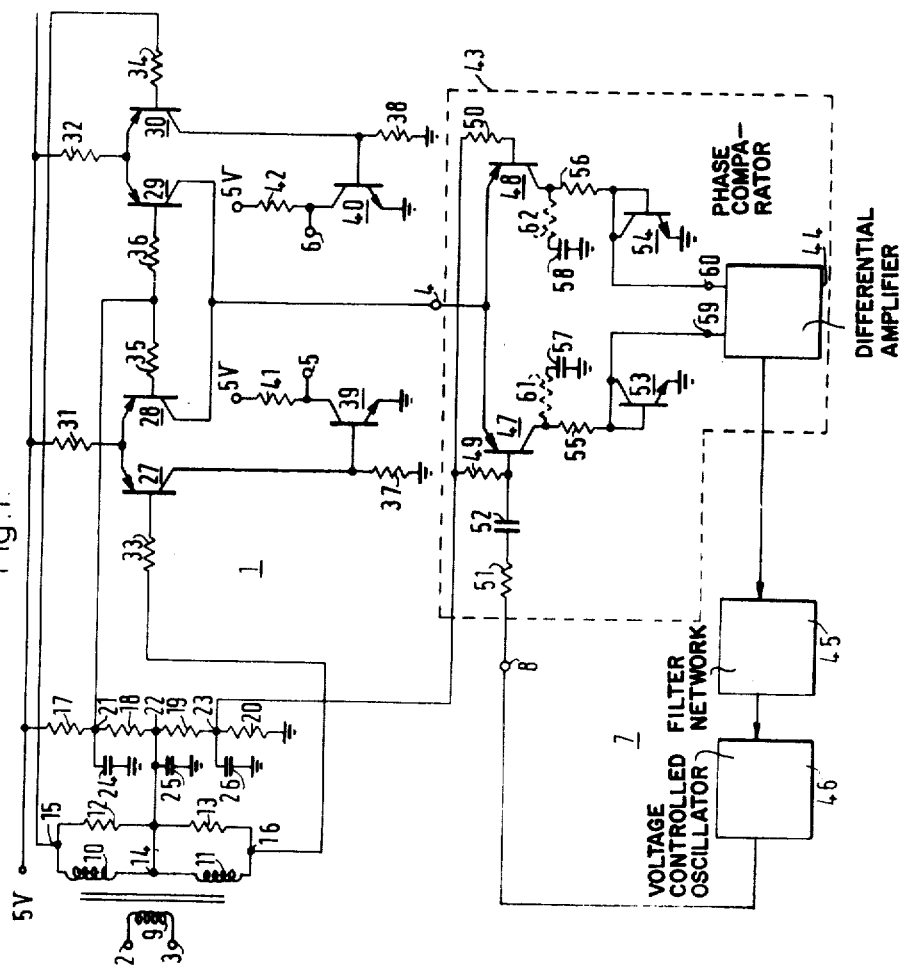
FIG. 1 is a schematic view of a timing extraction circuit according to the invention.

Principally referring to FIG. 1 the timing extraction circuit shown therein includes a pulse shaping and rectifying circuit 1, with input terminals 2, 3 and output terminals 4, 5 and 6, and a phase-locked loop 7 with input terminal 4 and output terminal 8. This circuit is particularly adapted, but not limited, to extract a clock pulse waveform CPW from an input pulse waveform i having a frequency of 34,368 MHz (megahertz) (third order hierarchical PCM level) and coded according to a three-level code, e.g. a so-called HDB3 code, with zero pulses, positive mark pulses and negative mark pulses.

The pulse shaping and rectifying circuit 1 includes an input transformer with primary winding 9 and secondary windings 10, 11. The primary winding 9 has input terminals 2, 3 and the secondary windings 10, 11 which are shunted by resistors, 12, 13, respectively, have a common terminal 14 and individual terminals 15, 16, respectively. The common junction point 14 of the windings 10, 11 and the resistors 12, 13 is connected to a tapping point 22 of a potentiometer which comprises resistors 17 to 20 connected between 5 V (volts) and ground. Tapping points 21, 22 and 23 between the pairs of resistors 17, 18; 18, 19 and 19, 20 are connected to ground from an AC viewpoint via capacitors 24, 25 and 26, respectively. Two pairs of transistors 27, 28 and 29, 30 have their emitters connected to 5 V via resistors 31 and 32, respectively. The bases of the transistors 27 and 30 are connected to terminals 16 and 15 via resistors 33 and 34, respectively, while the bases of transistors 28 and 29 are connected to tapping point 21 via resistors 35 and 36, respectively. The collectors of the transistors 28 and 29 are connected to output terminal 4, while those of transistors 27 and 30 are grounded via resistors 37 and 38, respectively. These collectors are also connected to the bases of NPN transistors 39, 40 with grounded emitters and with collectors connected to 5 V via resistors 41 and 42, respectively. The junction points of these collectors and resistors constitute the output terminals 5 and 6 of the pulse shaping and rectifying circuit 1.

The phase-locked loop 7 comprises the cascaded connection of a phase comparator circuit 43, a filter network 45 and a voltage controlled oscillator (VCO) 46. The phase comparator circuit 43 includes gating PNP transistors 47, 48 which have their emitters connected to input terminal 4 constituting a first input of the phase comparator 43. The bases of these gating transistors 47, 48 are connected to tapping point 23 of potentiometer 17–20 through resistors 49, 50, respectively. The phase comparator 43 further has a second input formed by the output terminal 8 of the phase-locked loop 7 and which is connected to the base of transistor 47 via resistor 51 and capacitor 52 in series. The collectors of the PNP transistors 47, 48 are each grounded via a filter circuit with two branches. A first branch comprises the series connection of a resistance 55 (56) and the base-to-emitter junction of an NPN transistor 53 (54), while a second branch comprises a capacitor 57 (58) and possibly a resistor 61 (62). The bases and collectors of these transistors are connected to input terminals 59, 60 of a differential amplifier 44.

The filter network 45 (not shown in detail) is of the lag-lead type well known in the art and comprises a series resistance branch and a parallel branch formed by the series connection of a resistance and a capacitor so that the phase-locked loop is a second order loop. Such a phase-locked loop is generally known in the art e.g. from the book "Phaselock Techniques" by F. M. Gardner, published by J. Wiley and Sons, Inc., 1966, pp. 7-13. The VCO provides a square output pulse waveform at a center frequency of 34,368 MHz.

Referring to FIGS. 1 and 2, the operation of the above described timing extraction circuit is as follows, when an input pulse waveform IPW (FIG. 2) coded according to the HDB3 code is supplied across the input terminals 2, 3.

When the applied pulse is a zero pulse the transistors 27 and 30 are conductive, whereas the transistors 28 and 29 are blocked because the bases of the transistors 27, 30 are at the potential of tapping point 22 whereas those of the transistors 28 and 29 are at the potential of tapping point 21, the latter potential being higher than that of tapping point 22. As a consquence a current flows from 5 V to ground, on the one hand, via resistor 31, the emitter-collector junction of transistor 27 and resistor 37, and, on the other hand, through resistor 32, the emitter-collector junction of transistor 30 and resistor 38. Due to this both transistors 39 and 40 become conductive so that the voltages at the terminals 5 and 6 both are near to zero volts thus indicating that a zero pulse is being received.

When a positive mark pulse, such as PM (FIG. 2), is applied across the input terminals 2, 3 of the primary winding 9 the potential of terminal 15 becomes higher than that of terminal 16 so that transistor 30 is blocked, whereas transistor 27 remains conductive. As a consequence transistor 29 becomes conductive, whereas transistor 28 remains blocked. Because the transistor 29 is conductive a current i (FIG. 2) is supplied to the first input 4 of the phase comparator 43 via resistor 32 and the emitter-to-collector connection of this transistor 29, while due to the transistor 30 being blocked also transistor 40 is blocked so that the potential of output terminal 6 raises to 5 V as indicated by the positive mark waveform PMW in FIG. 2. When the positive mark pulse PM ends, the transistor 29 is again blocked, while the transistor 30 again becomes conductive. From the above, it follows that each positive mark pulse, such as PM, gives rise to a shaped positive pulse PM' of the positive mark waveform PMW (FIG. 2) and to a current pulse, such as i', of the current pulse waveform i (FIG. 2).

In an analogous way, when a negative pulse, such as NW (FIG. 2), is applied across the input terminals 2, 3 of the primary winding the potential of terminal 16 becomes higher than that of terminal 15 so that transistor 27 is blocked, whereas transistor 30 remains conductive. As a consequence transistor 28 becomes conductive, whereas transistor 29 remains blocked. Because the transistor 28 is conductive a current i is supplied to the first input 4 of the phase comparator 43 via resistor 31 and the emitter-to-collector connection of this transistor 28, while due to the transistor 27 being blocked also transistor 39 is blocked so that the potential of output terminal 5 raises to 5 V as indicated by the negative mark waveform NMW in FIG. 2. When the negative mark pulse NM ends, the transistor 28 is again blocked, while the transistor 27 again becomes conductive. From the above, it follows that each negative mark pulse, such as NM, gives rise to a shaped positive pulse, such as NM', of the negative mark waveform NMW (FIG. 2) and to a current pulse, such as i" of, the current pulse waveform i (FIG. 2).

Summarizing, the pulse shaping and rectifying circuit 1 shapes the positive mark pulses of the input pulse waveform IPW applied to it, rectifies and shapes the negative mark pulses of this waveform, and finally generates a current pulse waveform i the pulses of which correspond to these positive and negative mark pulses.

In order to be able to correctly sample the pulses of the positive and negative mark waveforms PMW and NMW, a clock pulse waveform CPW (FIG. 2), the negative transitions of which ideally fall in the middle of the pulses of the current pulse waveform i, is now extracted from the latter waveform in the way described hereinafter.

This clock pulse waveform CPW is generated at the output of VCO 46 and applied to the second input 8 of the phase comparator 43 to the first input 4 of which the current pulse waveform i is applied. When the pulse waveforms i and CPW are perfectly synchronized, as is desired, the negative going transistions of the clock pulse waveform CPW occur exactly in the middle of the pulses of the current pulse waveform i. However, in the absence of synchronism a phase error such as Φ (FIG. 2), occurs between the negative-going transistions of the CPW and the middle of the pulses of waveform i.

Normally the bases of the transistors 47 and 48 of the phase comparator 43 are at the potential of tapping point 23 and this potential enables these transistors 47, 48 to become conductive when pulses of the current pulse waveform i are applied to their joint emitters. However, due to the fact that together with the latter pulses the clock pulse waveform CPW is applied to the base of gating transistor 47 via the resistor 51 and the capacitor 52 and that the tapping point 23 is grounded from an AC viewpoint the latter transistor 47 is blocked by the positive pulses portions PP of this clock pulse waveform CPW, so that only gating transistor 48 is conductive during the last mentioned positive pulse portions of clock pulse waveform CPW. On the other hand the gating transistor 47 becomes conductive during the negative portions NP of the clock pulse waveform CPW, while gating transistor 48 is then blocked. Thus, the clock pulse waveform CPW has a reverse effect on the transistors 47 and 48 and it is as if the inverse of the clock pulse waveform CPW is applied to transistor 48.

Each time the transistor 48 becomes conductive during the positive pulse portions PP of clock pulse waveform CPW a current flows from input terminal 4 to ground via the emitter-to-collector connection of this transistor 48 and the filter circuit comprising the capacitor 58 and the series connection of the resistor 56 and the base-to-emitter junction or diode junction of transistor 54. This is shown by the so called intermediate pulse waveform i+ of FIG. 2. In an analogous way, each time the transistor 47 becomes conductive during the negative pulse portions NP of clock pulse waveform of CPW a current flows from input terminal 4 to ground via the emitter-to-collector connection or diode junction of this transistor 47 and the filter circuit comprising the capacitor 57 and the series connection of resistor 55 and the base-to-emitter junction of transistor 53. This is represented by the so-called intermediate pulse waveform i− of FIG. 2.

From FIG. 2 it also becomes clear that when the negative going transitions of the clock pulse waveform CPW exactly occur in the middle of the pulses of the current pulse waveform i the durations of the pulses of the intermediate pulse waveforms i+ and i− are equal. On the contrary, when there is a phase shift $\Phi$ between these negative transitions and these middles the width of the pulses of waveform i+, (i−), increases while the width of the pulses of waveform i−, (i+), decreases. However, the sum of the durations of the pulses of the waveforms i+ and i− derived from the same pulse of the current pulse waveform i is constant.

From FIG. 2, it more particularly also follows that:
$2\pi$p.I is the surface of each pulse of waveform i;
$(\pi p + \Phi)$ I is the surface of each pulse of waveform i+;
$(\pi p - \Phi)$ I is the surface of each pulse of waveform i−
wherein:
p is the duty ratio of the waveform i;
I is the amplitude of the pulses of the waveforms i, i+ and i−; and
$\Phi$ is the algebraic value of the phase error in radians.

To obtain the mean amplitude values of waveforms i, i+ and i− over a single period a division by $2\pi$ is required, while to obtain the mean amplitude values $\bar{i}$, $\bar{i}+$ and $\bar{i}-$ over all the periods a multiplication by the mark or pulse density d of the current pulse waveform i is necessary. Hence:

$$\bar{i} = p.d.I \tag{1}$$

$$\bar{i}+ = (\pi p + \Phi)d.I/2\pi \tag{2}$$

$$\bar{i}- = (\pi p - \Phi) d.I/2\pi \tag{3}$$

so that $$\bar{i}+ - \bar{i}- + \Phi \bar{i}/\pi p \tag{4}$$

From the relations (2) and (3) it follows that the ratio $\bar{i}+/\bar{i}-$ is independent from the pulse density d and the same is true for $(\bar{i}+ - \bar{i}-)/\bar{i}$. Based on this insight a signal proportional to these ratios is generated at the output of the phase comparator 43 in the way described hereinafter.

Returning to the filter circuit 53, 55, 57 to which the pulse waveform i− is applied, the capacitor 57 is charged during each of the positive pulses of this waveform and discharged during the time intervals between these pulses, all with a time constant equal to (R55+R53).C57 wherein:
R55 is the resistance value of resistor 55;
R53 is the variable resistance value of the base-to-emitter diode or junction of transistor 53; and
C57 is the capacitance value of capacitor 57.

It is clear that the voltage waveform thus appearing across the capacitor 57 is dependent on the amplitude I, the pulse density p and the duty ratio d of the current waveform i−, but due to the filtering effect of the circuit 55, 53, 57 the variations of this voltage waveform are considerably reduced when compared with those of the latter current waveform i−. The variations of the latter waveform i− may indeed be relatively considerable because the pulse density d may, for instance, vary between 1 and 0.25 (one mark sign followed by three space signs). Due to the presence of this voltage waveform across the capacitor 57 a current is made to flow in the filter circuit branch comprising the resistor 55 and the base-to-emitter junction of transistor 53. Although the resistance R53 of the latter junction varies with the current flowing therein the current flowing in the branch 55, 53 is substantially independent from this variable resistance R53 due to the presence of the resistance R55 which has been chosen much larger than the resistance R53, so that any variation of resistance of R53 is substantially masked by resistance R55. As a consequence the current flowing in the branch 55, 53 varies in the same way as the voltage across the capacitor 57 and is a function of the same variables as the voltage waveform. Since no DC current can flow in the branch 57, the DC component of the current waveform flowing in the branch 55, 53, is equal to the DC component or mean amplitude value $\bar{i}-$ of the current waveform i−. Therefore, the following relation may be written between this mean amplitude value $\bar{i}-$ and the voltage v− at the junction point 59 of the resistor 55 and the base and collector of transistor 53:

$$\bar{i}- = Io \, (e^{\,v-/vo} - 1)$$

or, approximately, $$\bar{i}- = Io \, (e^{v-/vo}) \tag{5}$$

wherein Io is the so-called reverse saturation current of transistor 53 and vo is the product of the electron-volt equivalent of temperature and a parameter which is a function of the transistor material used.

Likewise, one may write for mean amplitude value $\bar{i}+$ of the current flowing in the branch 56, 54 of the circuit 56, 54, 58:

$$\bar{i}+ = I'o(e^{\,v+/v-}) \tag{6}$$

wherein $v+$ is the voltage at the junction point 60 of the resistor 56 and the base and the collector of transistor 54 and $I'o$ is the reverse saturation current of this transistor.

From the above relations (4), (5) and (6) it follows that when both transistors 53 and 54 are matched, i.e. when $Io = I'o$, and when $(\bar{i}+ - \bar{i}- /\bar{I}\,)^2$ may be neglected, one has approximately:

$$v+ \,-\, v- \,=\, vo \ln \frac{\bar{i}+}{\bar{i}-} = vo \ln \frac{1 + \frac{\bar{i}+ - \bar{i}-}{\bar{i}}}{1 - \frac{\bar{i}+ - \bar{i}-}{\bar{i}}}$$

$$= vo \ln \frac{(1 + \frac{\bar{i}+ - \bar{i}-}{\bar{i}})^2}{1 - (\frac{\bar{i}+ - \bar{i}-}{\bar{i}})^2}$$

$$= 2vo \frac{\bar{i}+ - \bar{i}-}{\bar{i}}$$

$$= \frac{2vo\,\phi}{\pi p}$$

This means that the difference between the voltage signals $V+$ and $v-$ at the terminals 60 and 59 of the phase comparator 43 is independent from the pulse density d of the current pulse waveform i and, therefore, also from the pulse density of the input pulse waveform IPW. This voltage difference is made in the differential amplifier 44 and the resultant error voltage signal appearing at the output thereof is applied to the input 8 of the phase comparator 43 via the filter network 45 and the voltage-controlled oscillator 46 to reduce the phase error $\Phi$ to zero.

The circuit of FIG. 1 may be modified by eliminating the filter network 45 and changing the filter circuits 53, 55, 57 and 54, 56, 58 in such a way that they perform the function of this filter network 45. This may be done by inserting an additional resistor 61 and 62 in series with the capacitor 57 and 58, respectively. The thus obtained filter circuits have a transfer characteristic which is of the same type as that of the filter network 45 because these networks are equivalent according to the Thevenin and Norton theorems, bearing in mind that the variable resistances R53 and R54 are much smaller than resistances R55 and R56, respectively, so that the total resistances R53+R55 and R54+R56 are substantially constant.

While the principles of the invention have been described above in connection with specific apparatus, it is to be clearly understood that this description is made only by way of an example and not as a limitation on the scope of the invention.

I claim:

1. A circuit for extracting a clock pulse waveform from an input pulse waveform comprising:
a phase-locked loop including
a phase comparator having a first input to which said input waveform is coupled, a second input and an output which is coupled in cascade with at least a voltage controlled oscillator whose output is coupled to said second input, said clock waveform being present at said output of said oscillator and having negative going transitions occurring substantially in the middle of the pulses of said input waveform;
said phase comparator including
gating means coupled to said first and second inputs controlled by said clock waveform and said input waveform to produce first and second intermediate pulse waveforms each having pulses constituted by different portions of the pulses of said input waveform and proportional to the pulse density of said input waveform,
filter means connected directly to said gate means responsive to said first and second intermediate waveforms to produce first and second output waveforms which are equal to the mean amplitude values of said first and second intermediate waveforms, and
subtractor means coupled to said filter means to produce a comparator output signal at said output of said comparator which is a function of the ratio of said first and second output waveforms and independent of the pulse density of said input waveform,
said gating means including
first and second gates each receiving said input waveform, said first and second gates being interconnected such that one of said first and second gates receives said clock waveform to control both of said first and second gates to produce said first intermediate waveform at the output of one of said first and second gates and said second intermediate waveform at the output of the other of said first and second gates, and
said filter means includes
first and second filter circuits each coupled to a different one of the outputs of said first and second gates to produce said first output waveform at the output of one of said first and second filter circuits and said second output waveform at the output of the other of said first and second filter circuits.

2. A circuit according to claim 1, wherein
one of said first and second filter circuits produces therein a first filter signal proportional to the logarithm of one of said first and second output waveforms, and
the other of said first and second filter circuits produces therein a second filter signal proportional to the logarithm of the other of said first and second output waveforms.

3. A circuit for extracting a clock pulse waveform from an input pulse waveform comprising:
a phase-locked loop including
a phase comparator having a first input to which said input waveform is coupled, a second input and an output which is coupled in cascade with at least a voltage controlled oscillator whose output is coupled to said second input, said clock waveform being present at said output of said oscillator and having negative going transitions occurring substantially in the middle of the pulses of said input waveform;
said phase comparator including
gating means coupled to said first and second inputs controlled by said clock waveform and said input waveform to produce first and second intermediate pulse waveforms each having pulses constituted by different portions of the pulses of said input waveform and proportional to the pulse density of said input waveform, filter means connected directly to said gate means responsive to said first and second intermediate waveforms to produce first and second output waveforms which are equal to the mean amplitude values of said first and second intermediate waveforms, and subtractor means coupled to said filter means to produce a comparator output signal at said output of said comparator which is a function of the ratio of said first and second output waveforms and independent of the pulse density of said input waveform;

said gating means including first and second gating circuits each receiving said input waveform, said first and second gating circuits being interconnected such that one of said first and second gating circuits receives said clock waveform to control both of said first and second gating circuits to produce said first intermediate waveform at the output of one of said first and second gating circuits and said second intermediate waveform at the output of the other of said first and second gating circuits, and said filter means including first and second filter circuits each coupled to a different one of the outputs of said first and second gating circuits to produce said first output waveform at the output of one of said first and second filter circuits and said second output waveform at the output of the other of said first and second filter circuits one of said first and second filter circuits producing therein a first filter signal proportional to the logarithm of one of said first and second output waveforms, and the other of said first and second filter circuits producing therein a second filter signal proportional to the logarithm of the other of said first and second output waveform;

each of said and second filter circuits including a first branch having at least a capacitor, and a second branch having at least a first resistor and a diode connected in series, one of said first and second output waveforms flowing in one of said second branches and the other of said first and second output waveforms flowing in the other of said second branches, and one of said first and second filter signals being generated across one of said diodes and the other of said first and second filter signals being generated across the other of said diodes.

4. A circuit according to claim 3, wherein
each of said diodes is constituted by the base-to-emitter junction of a different one of two transistors.

5. A circuit according to claim 3, wherein
said subtractor means includes
a differential amplifier having one of its inputs coupled to one of said second branches and the other of the inputs coupled to the other of said second branches to provide said comparator output signal at its output.

6. A circuit according to claim 3, wherein
in each of said second branches the resistance value of said first resistor is much greater than the resistance value of said diode.

7. A circuit according to claim 3, wherein
each of said branches further includes
a second resistor connected in series with said capacitor, and said output of said phase comparator is directly connected to said oscillator.

8. A circuit according to claim 3, wherein
said phase-locked loop further includes
a filter network coupled between said output of said phase comparator and said oscillator to provide a second order phase-locked loop.

9. A circuit for extracting a clock pulse waveform from an input waveform having zero pulses, positive mark pulses and negative mark pulses present, at an input to said circuit comprising:

means coupled to said circuit input to shape and rectify said input waveform to produce a current pulse waveform corresponding to said input waveform; and a phase-locked loop including a phase comparator having a first input coupled to said means to receive said current waveform, a second input and an output which is coupled in cascade with at least a voltage controlled oscillator whose output is coupled to said second input, said clock waveform being present at said output of said oscillator and having negative going transitions occurring substantially in the middle of the pulses of said current waveform;

said phase comparator including gating means coupled to said first and second inputs controlled by said clock waveform and said current waveform to produce first and second intermediate pulse waveforms each having pulses constituted by different portions of the pulses of said current waveform and proportional to the pulse density of said input waveform, filter means coupled to said gate means responsive to said first and second intermediate waveforms to produce first and second output waveforms which are equal to the means amplitude values of said first and second intermediate waveforms, and substractor means coupled to said filter means to produce a comparator output signal at said output of said comparator which is a function of the ratio of said first and second output waveforms and independent of the pulse density of said input waveform.

* * * * *